United States Patent
Li et al.

(10) Patent No.: US 10,700,651 B2
(45) Date of Patent: Jun. 30, 2020

(54) WIDE BANDPASS FILTERING POWER AMPLIFIER

(71) Applicant: South China University of Technology, Guangzhou, Guangdong (CN)

(72) Inventors: Yuanchun Li, Guangdong (CN); Qinchuang Chen, Guangdong (CN); Quan Xue, Guangdong (CN)

(73) Assignee: South China University of Technology, Guangzhou (CN)

( * ) Notice: Subject to any disclaimer, the term of this patent is extended or adjusted under 35 U.S.C. 154(b) by 20 days.

(21) Appl. No.: 16/191,409

(22) Filed: Nov. 14, 2018

(65) Prior Publication Data

US 2020/0028478 A1 Jan. 23, 2020

(30) Foreign Application Priority Data

Jul. 23, 2018 (CN) .......................... 2018 1 0815617

(51) Int. Cl.
*H03F 3/217* (2006.01)
*H01P 7/08* (2006.01)
*H03F 1/02* (2006.01)

(52) U.S. Cl.
CPC .......... *H03F 3/2171* (2013.01); *H01P 7/082* (2013.01); *H03F 1/0205* (2013.01); *H03F 2200/171* (2013.01); *H03F 2200/222* (2013.01); *H03F 2200/387* (2013.01); *H03F 2200/423* (2013.01)

(58) Field of Classification Search
USPC .......................... 330/302, 305–306, 251, 277
See application file for complete search history.

(56) References Cited

U.S. PATENT DOCUMENTS

| 8,558,622 B2 * | 10/2013 | Uno .......................... H03F 1/32 330/302 |
| 2009/0039962 A1 * | 2/2009 | Uno .......................... H03F 1/56 330/286 |

* cited by examiner

*Primary Examiner* — Hieu P Nguyen

(57) ABSTRACT

A wide bandpass filtering power amplifier using discriminating coupling is disclosed, which comprises a DC bias circuit, an input impedance matching circuit, a transistor and an output impedance matching circuit. The DC bias circuit is connected to the input impedance matching circuit which is further connected to the transistor, and the transistor is further connected to the output impedance matching circuit which comprises a tuning microstrip line and a bandpass filter. The complexity and the area of the impedance matching circuit in the power amplifier are effectively reduced. At the same time, the filtering PA has good frequency selectivity by using the discriminating coupling BPF. Meanwhile the work efficiency and bandwidth of the filtering power amplifier are effectively improved by taking both of the extended continuous mode theory and filter synthesis theory into account.

14 Claims, 5 Drawing Sheets

WIDE BANDPASS FILTERING POWER AMPLIFIER

CROSS-REFERENCE TO RELATED APPLICATIONS

The present application claims the benefits of Chinese Patent Application No. 2018108156177, filed on Jul. 23, 2018, the content of which is incorporated herein by reference in its entirety.

TECHNICAL FIELD

The present disclosure relates generally to technical fields of a power amplifier, and more particularly, to a wide bandpass filtering power amplifier.

BACKGROUND

With the development of communication technology, the standard of wireless communication system has the characteristics of high data rate, large user capacity and low power consumption. As a key component of front-end, power amplifier has a great influence on transmitter performance. Therefore, the power amplifier with high efficiency and broadband operation has made considerable progress.

To improve efficiency, a variety of switch mode PAs are proposed, such as Class-D, Class-E and Class-F PAs. Theoretically, the efficiency of the above power amplifier can reach 100%. Doherty and envelope tracking structure are used to improve efficiency and linearity. To maintain bandwidth efficiency and maintain high efficiency, various technologies have been put forward. On the basis of standard switch mode PAs, continuous Class-B/J, continuous Class-F and continuous Class-$F^{-1}$, are proposed, which alleviate the requirement on terminating impedance of harmonics from fixed values into purely reactive regions and thus achieve satisfactory bandwidth. After that, extended continuous mode PA further relaxes the requirements of harmonic impedances to reactive-resistive ones with a small degradation in efficiency.

Power amplifiers are usually cascaded with low insertion loss bandpass filters to suppress the out-of-band interference. Although the bandwidth of the continuous power amplifier has reached one octave, the overall bandwidth and efficiency are degraded due to the interconnection mismatching and insertion loss of the filter. In order to overcome this problem, the co-design of power amplifier and bandpass filter has been studied widely. They mainly focus on miniaturization, power efficiency enhancement (PAE) and selectivity improvement.

However, the preceding filtering PA designs have high selectivity and overall PAE, while the bandwidth with large PAE is relatively small due to the limited design freedom.

SUMMARY

The object of the present application is to provide a wide bandpass filtering power amplifier which takes both of the extended continuous mode theory and filter synthesis theory into account. The work efficiency and bandwidth of the filtering power amplifier are effectively improved, while the complexity and the area of the power amplifier are effectively reduced.

In one aspect, a wide bandpass filtering power amplifier is provided, comprising a DC (direct current) bias circuit, an input impedance matching circuit, a transistor and an output impedance matching circuit. The DC bias circuit is connected to the input impedance matching circuit which is further connected to the transistor. Meanwhile the transistor is connected to the output impedance matching circuit which comprises a tuning microstrip line and a bandpass filter, wherein the tuning microstrip line is connected between the transistor and the bandpass filter (BPF).

In a preferable embodiment of the present application, the bandpass filter comprises a first resonator and a second resonator parallelly coupled with each other.

In the wide bandpass filtering power amplifier according to the present application, the first resonator comprises a first short end and a first open end, and the second resonator comprises a second short end and a second open end, wherein the first resonator has a coupling region of ⅔ L1 starting from the first short end and the second resonator has a coupling region of ⅔ L2 starting from the second open end, wherein L1 represents a length of the first resonator and L2 represents a length of the second resonator.

In a preferable embodiment of the present application, the first short end of the first resonator is aligned with the second open end of the second resonator. In a further preferable embodiment of the present application, $L1=L2=\lambda_g/4$, wherein $\lambda_g$ represents a waveguide wavelength at working frequency. In a further preferable embodiment of the present application, the first short end of the first resonator is connected to a DC power source, and is further grounded via a capacitor.

In the wide bandpass filtering power amplifier according to the present application, an input terminal of the bandpass filter is connected to the first resonator, and an output terminal of the bandpass filter is connected to the second resonator.

In the wide bandpass filtering power amplifier according to the present application, an input terminal of the tuning microstrip line is connected to a drain of the transistor, an output terminal of the tuning microstrip line is connected to an input terminal of the bandpass filter whose output terminal is matched to a load impedance.

In the wide bandpass filtering power amplifier according to the present application, a length of the tuning microstrip line depends on an imaginary part of an optimal fundamental impedance matching point.

In the wide bandpass filtering power amplifier according to the present application, the first resonator comprises a first microstrip line, a second microstrip line, a third microstrip line and a fourth microstrip line connected sequentially, and the second resonator comprise a fifth microstrip line, a sixth microstrip line, a seventh microstrip line and an eighth microstrip line connected sequentially.

In a preferable embodiment of the present application, the second microstrip line, the third microstrip line and the fourth microstrip line of the first resonator are respectively parallelly coupled with the fifth microstrip line, the sixth microstrip line and the seventh microstrip line of the second resonator. In a further preferable embodiment of the present application, the second microstrip line, the third microstrip line and the fourth microstrip line of the first resonator are connected in a direct line, while the fifth microstrip line, the sixth microstrip line and the seventh microstrip line of the second resonator are also connected in a direct line. In a further preferable embodiment of the present application, the first microstrip line and the second microstrip line of the first resonator are vertically connected with each other, while the seventh microstrip line and the eighth microstrip line of the second resonator are connected with each other in a direct line.

In a further preferable embodiment of the present application, an input terminal of the band-pass filter is connected between the third microstrip line and the fourth microstrip line, and an output terminal of the band-pass filter is connected between the seventh microstrip line and the sixth microstrip line.

In the wide bandpass filtering power amplifier according to the present application, the input impedance matching network of the bandpass filter is a Chebyshev bandpass filter.

In the wide bandpass filtering power amplifier according to the present application, the transistor is a GaN HEMT CGH40010F transistor.

By the implementation of the wide bandpass filtering power amplifier, several advantages can be obtained. The complexity and the area of the impedance matching circuit in the conventional Class-$F^{-1}$ power amplifier are effectively reduced by integrating the DC bias circuit into the bandpass filter, while satisfying the selectivity of the PA. Meanwhile the work efficiency and bandwidth of the filtering power amplifier are effectively improved by taking the extended continuous mode theory and filter synthesis theory into account to guide the impedance matching design of the wide bandpass filtering power amplifier.

BRIEF DESCRIPTION OF THE DRAWINGS

To illustrate more clearly the technical scheme of the embodiments of the present application, the accompanying drawings to be used in the description of the present embodiment will be briefly described below. The drawings described below are only some embodiments of the present application, and for one skilled in the art other drawings may be obtained from them without creative effort.

DETAILED DESCRIPTION OF THE PREFERRED EMBODIMENT

These and other advantage, aspect and novel features of the present application, as well as details of an illustrated embodiment thereof, will be more fully understand from the following description and drawings. Apparently, the described embodiments are some embodiments of the present application, rather than all of them. Based on the embodiments of the present application, all other embodiments acquired by one skilled in the art without creative work shall fall within the scope of the present application.

It should be noted that, the terms "first", "second", "third" and "fourth" in the descriptions, claims and the appended drawings of the present application are used to distinguish different objects, rather than to describe a particular order. In addition, the terms "include", "have", "comprise", the likes, and any variants of them, are intended to cover any other possible inclusions.

Hereinafter, embodiments of the present application will be described in detail with reference to the accompanying drawings.

Figure 1:
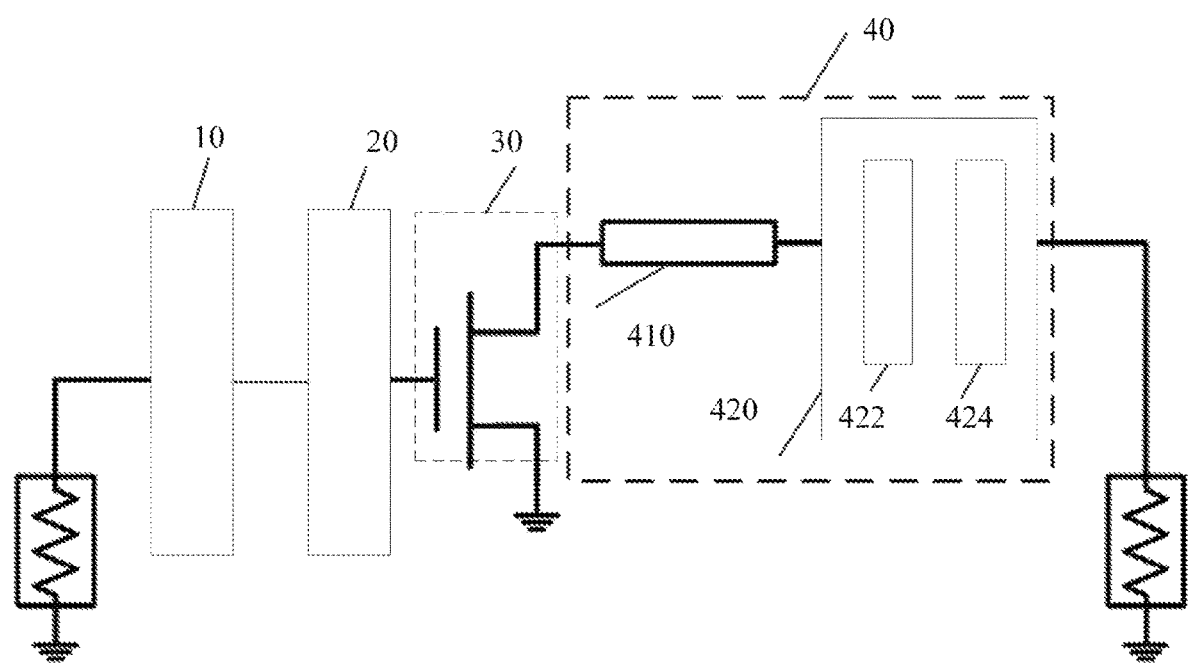
FIG. 1 is a block diagram of a wide bandpass filtering power amplifier using discriminating coupling according to an embodiment of the present application.

FIG. 1 is a block diagram of a wide bandpass filtering power amplifier using discriminating coupling according to an embodiment of the present application. As shown in FIG. 1, the wide bandpass filtering power amplifier using discriminating coupling comprises a DC (direct current) bias circuit 20, an input impedance matching circuit 10, a transistor 30 and an output impedance matching circuit 40. The DC bias circuit 20 is connected to the input impedance matching circuit 10 which is further connected to the transistor 30. Meanwhile the transistor 30 is connected to the output impedance matching circuit 40 which comprise a tuning microstrip line 410 and a bandpass filter 420, wherein the tuning microstrip line 410 is connected between the transistor 30 and the bandpass filter 420. The bandpass filter 420 comprises a first resonator 422 and a second resonator 424 parallelly coupled with each other.

To be specific, the input terminal circuit of the transistor 30 is consisted of the DC bias circuit 20 and the input impedance matching circuit 10, for improving the roll-off at the passband edge. In the present embodiment, the mentioned DC bias circuit 20 and the input impedance matching circuit 10 can be the prior DC bias circuit and input impedance matching circuit used in the prior conventional Class-$F^{-1}$ power amplifier, and are not described in the present application for concise.

To be specific, in the present application, the output terminal circuit of the transistor 30 consists of the tuning microstrip line 410 and the bandpass filter 420 with harmonic suppression and harmonic control functions. In the present application, the bandpass filter 420 has harmonic suppression, harmonic control as well as DC biasing functions. The bandpass filter 420 consists of the first resonator 422 and the second resonator 424 parallelly coupled with each other and both having a length of $\lambda_g/4$, wherein $\lambda_g$ represents a waveguide wavelength at working frequency. Accordingly, the second harmonic and the fourth harmonic can be suppressed.

To be specific, in the present application, the bandpass filter 420 can be a Chebyshev bandpass filter. In a more preferable embodiment, the transistor 30 can be a GaN HEMT CGH40010F transistor from Cree.

Furthermore, as shown in FIG. 1, an input terminal of the tuning microstrip line 410 is connected to a drain of the transistor 30, an output terminal of the tuning microstrip line 410 is connected to an input terminal of the bandpass filter 420 whose output terminal is matched to a load impedance. The tuning microstrip line has an impedance conversion function. The optimal fundamental impedance matching point located at the transistor package plane can be converted to be an impedance with a small imaginary part, which is then matched with the load impedance via the bandpass filter.

Figure 2:
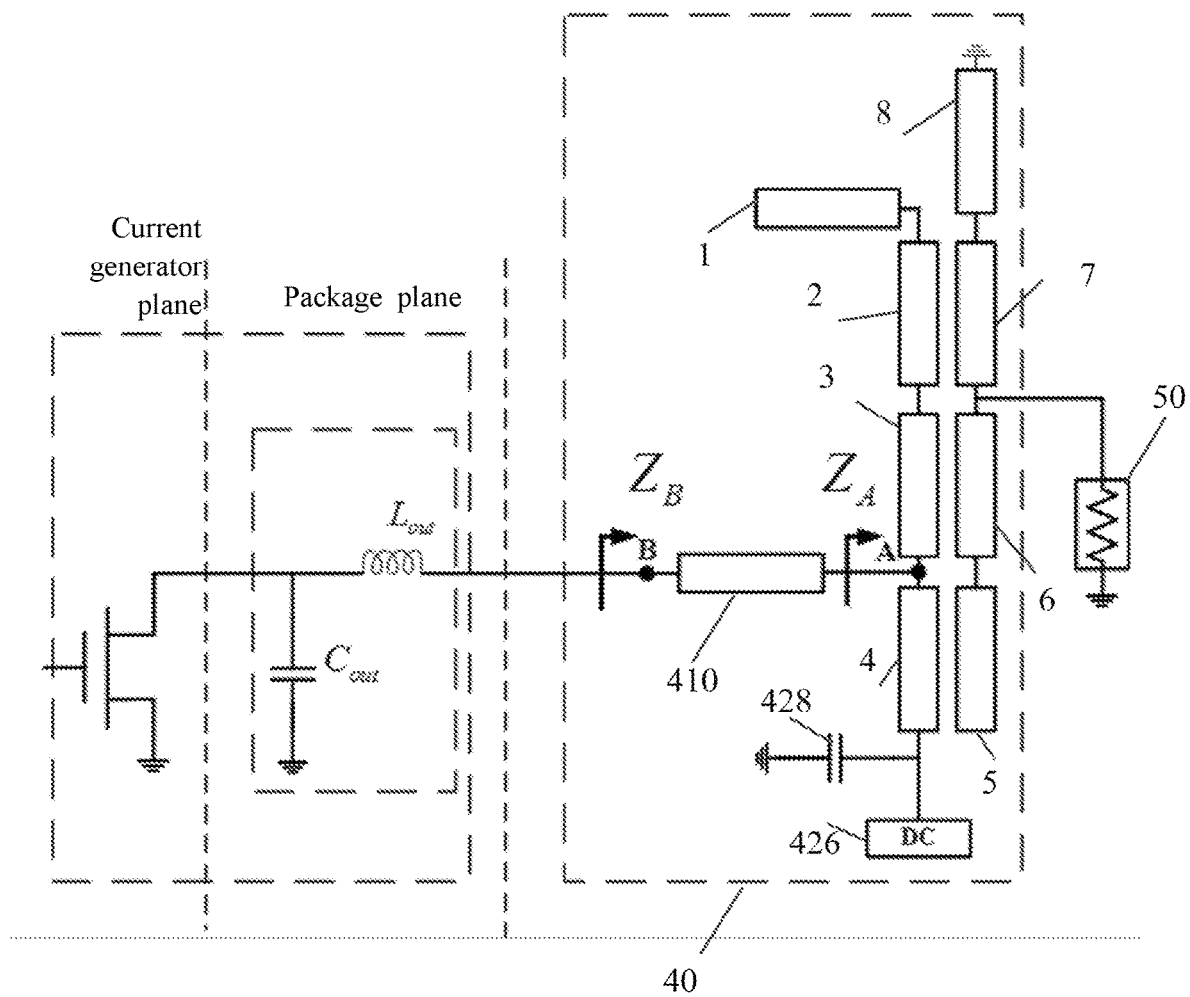
FIG. 2 is a circuit diagram of a discriminating coupling bandpass filtering output matching network of power amplifier according to an embodiment of the present application.

FIG. 2 is a circuit diagram of a wide bandpass filtering power amplifier using discriminating coupling according to an embodiment of the present application. As shown in FIG. 2, the first resonator 422 comprises a first short end and a first open end, and the second resonator 424 comprises a second short end and a second open end. The first resonator 422 has a coupling region of ⅔ L1 starting from the first short end and the second resonator 424 has a coupling region of ⅔ L2 starting from the second open end, wherein L1 represents the length of the first resonator 422 and L2 represents the length of the second resonator 424. The first short end of the first resonator 422 is aligned with the second open end of the second resonator 424. In a further preferable embodiment of the present application, L1=L2=$\lambda_g$/4, wherein $\lambda_g$ represents the waveguide wavelength at working frequency. In this way, the third harmonic can be suppressed by reasonably choosing the coupling regions of the two resonators, so that the bandpass filter can suppress the second, third and fourth harmonics and provide the second harmonic and the third harmonic control function.

Furthermore, as shown in FIG. 2, the first short end of the first resonator 422 is connected to a DC power source 426, and is further grounded via a capacitor 428. Thus, while providing harmonic suppression and harmonic control, the bandpass filter also has a DC biasing function by connecting the short end with the DC power source.

Furthermore, as shown in FIG. 2, the input terminal of the bandpass filter 420 is connected to the first resonator 422, and the output terminal of the bandpass filter 420 is connected to the second resonator 424. The detail connection position can be adjusted according to the input matching and the output matching of the bandpass filter 420. In this way, the impedance condition of the extended continuous Class-$F^{-1}$ power amplifier can be satisfied by adjusting the length of the resonator of the bandpass filter, the connection position of the input and output terminals and the distance between the two resonators.

Furthermore, as shown in FIG. 2, the first resonator 422 (referring FIG. 1) comprises a first microstrip line 1, a second microstrip line 2, a third microstrip line 3 and a fourth microstrip line 4 connected sequentially, and the second resonator 424 (referring FIG. 1) comprise a fifth microstrip line 5, a sixth microstrip line 6, a seventh microstrip line 7 and an eighth microstrip line 8 connected sequentially. In the present embodiment, the second microstrip line 2, the third microstrip line 3 and the fourth microstrip line 4 of the first resonator 422 are respectively parallelly coupled with the fifth microstrip line 5, the sixth microstrip line 6 and the seventh microstrip line 7 of the second resonator 424.

The input terminal of the bandpass filter 420 is connected between the third microstrip line 3 and the fourth microstrip line 4, and the output terminal of the bandpass filter 420 is connected between the seventh microstrip line 7 and the sixth microstrip line 6. It should be noted that, the input terminal of the bandpass filter 420 can be arranged at different locations on the first, second, third and fourth microstrip lines 1-4, and meanwhile the output terminal of the bandpass filter 420 can also be arranged at different locations on the fifth, sixth, seventh and eight microstrip lines 5-8, and both of which can be adjusted according to the output matching impedance.

In a further preferable embodiment of the present application, the second microstrip line 2, the third microstrip line 3 and the fourth microstrip line 4 of the first resonator 422 are connected in a direct line, while the fifth microstrip line 5, the sixth microstrip line 6 and the seventh microstrip line 7 of the second resonator 424 are also connected in a direct line. In such a way, the second microstrip line 2, the third microstrip line 3 and the fourth microstrip line 4 are parallelly coupled with the fifth microstrip line 5, the sixth microstrip line 6 and the seventh microstrip line 7. It should be noted that, there can be different connection manners between the first microstrip line 1 and the second microstrip line 2, and between the seventh microstrip line 7 and the eighth microstrip line 8, so long as the first microstrip line 1 and the eighth microstrip line 8 are not parallelly coupled. FIG. 2 has shown a propositional structure, in which the first microstrip line 1 and the second microstrip line 2 of the first resonator 422 are vertically connected with each other, while the seventh microstrip line 7 and the eighth microstrip line 8 of the second resonator 424 are connected with each other in a direct line. Through such kinds of structures, the coupling region of the two resonators can be guaranteed to have the third harmonic suppression effect.

The working principle of the wide bandpass filtering power amplifier using discriminating coupling provided by the present application is analyzed in detail below.

Figure 3:
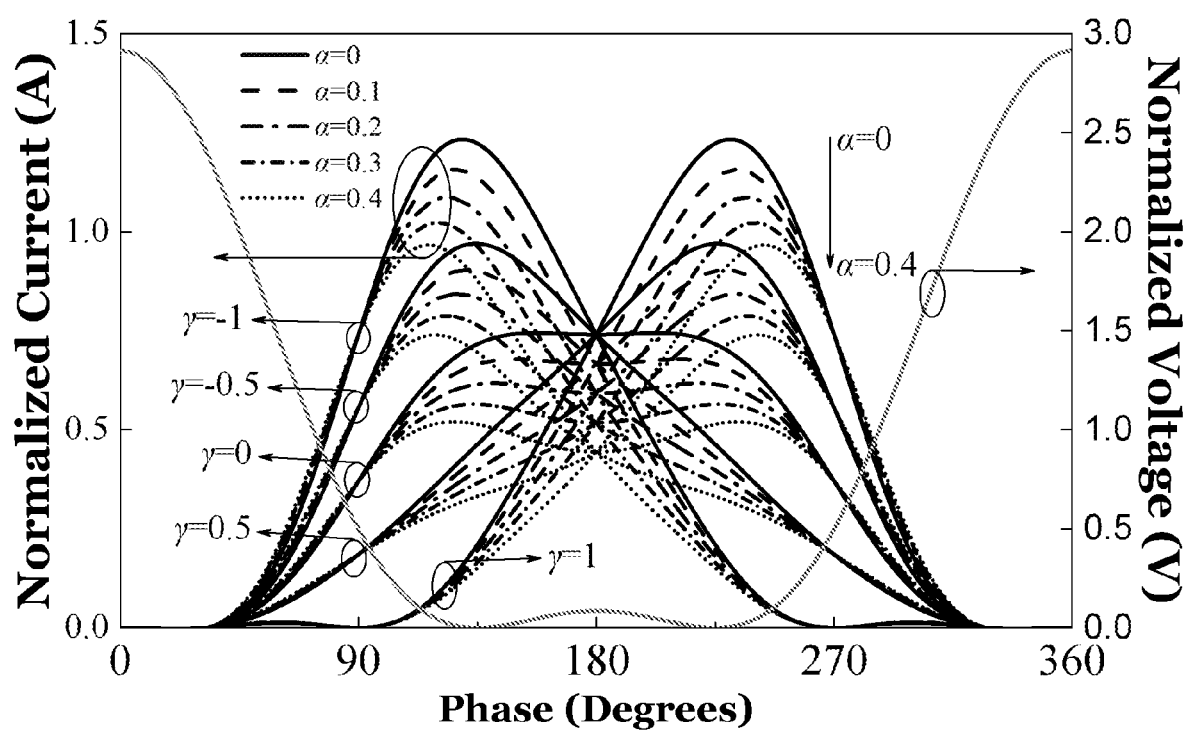
FIG. 3 is a schematic diagram of the theoretical normalized voltage and current waveforms at the drain of an ideally extended continuous Class-$F^{-1}$ power amplifier.

FIG. 3 is a schematic diagram of the theoretical normalized voltage and current waveforms at the drain of an ideally extended continuous Class-$F^{-1}$ ($CCF^{-1}$) power amplifier, which is the wide bandpass filtering power amplifier using discriminating coupling provided by the present application. The standard Class-$F^{-1}$ mode PA needs the optimum impedance for the fundamental signal, as well as a constant open-circuit for the second harmonic and short-circuit for the third harmonic. However, the harmonic impedance of the output matching network (OMN) changes at the edge of Smith Chart and should be difficult to be kept as zero or infinite for different harmonics, which limits the bandwidth of high-efficiency PA. The extended $CCF^{-1}$ mode PA with resistive second harmonic impedance is put forward for expanding the impedance region in the Smith Chart.

The normalized drain voltage of the extended $CCF^{-1}$ mode PA is the same as that of the standard Class-$F^{-1}$ mode, which is described as in (1)

$$v_{ds}(\theta) = \left(\frac{1}{\sqrt{2}} + \cos\theta\right)^2 = 1 + \frac{2}{\sqrt{2}}\cos\theta + \frac{1}{2}\cos 2\theta. \quad (1)$$

On the basis of the conventional Class-$F^{-1}$ amplifier's current expression, the parameters $\gamma$ and $\alpha$ are introduced to shape the waveforms. Equation (2) represents the normalized drain current as follows:

$$i_{ds}(\theta)=(i_{DC}-i_1 \cos\theta+i_3 \cos 3\theta)\cdot(1-\gamma \sin\theta)\cdot(1+\alpha \cos\theta)-1\leq\gamma\leq 1. \quad (2)$$

where, $i_{DC}$=0.37, $i_1$=0.43, $i_3$=0.06.

As shown in FIG. 3, the normalized voltage and current waveforms of the extended $CCF^{-1}$ mode are depicted, in which it can be found that the voltage waveform maintains a half-sinusoidal function. However, when $\alpha$ increases, the amplitude of the current waveform decreases, which results in a light deterioration of output power and drain efficiency. The normalized optimal admittance could be calculated through equation (3) as follows:

$$Y_n = -\frac{I_{ds,n}}{V_{ds,n}}. \quad (3)$$

However, the operating bandwidth of the transistor is increased while the efficiency and output power are maintained through the expanding of the impedance condition of the extended continuous Class-$F^{-1}$ power amplifier of the present application. To achieve this ideal efficiency, the nth normalized harmonics load admittances are derived in (4) as follows:

$$Y_1 = \left(-\frac{1}{\sqrt{2}}\left((0.37\alpha - 0.43) + j\gamma\left(\frac{0.49\alpha}{4} - 0.37\right)\right)\right) \cdot G_{opt} \quad (4).$$

$$Y_2 = (0.37\alpha + j\gamma(0.37\alpha - 0.49)) \cdot G_{opt}$$

$$Y_3 = \infty.$$

In which, $G_{opt}$ is the optimal conductance of the fundamental wave and $Y_n$ is the nth harmonic admittance. The output matching network matches the harmonics to the corresponding impedance conditions on the current generator surface.

Accordingly, the design flexibility is expanded and the second harmonic admittance is not limited in a purely reactive region as before. Moreover, $\alpha$ is determined to be in the range from 0 to 0.4 to guarantee the efficiency higher than 70% by calculating the drain efficiency. Each harmonic admittance of the Output Matching Network should present in the corresponding regions of Smith Chart.

However, as shown in FIG. 2, there are many parasitic components between the output pin and the actual drain of the internal chip, such as parasitic inductance $L_{out}$ and parasitic capacitance $C_{out}$ during the actual applications. Therefore, when designing the output matching network, the influence of parasitic components should be taken into account, while the specific values of the parasitic inductance and parasitic capacitance can be obtained from the producer.

The BPF with discriminating coupling is used as OMN to make the fundamental and second harmonic impedances located in the high efficiency regions, respectively for designing wideband high efficiency PA with a filtering response, as the OMN is the most important part in PA design which determines the output power, efficiency and bandwidth.

Figure 4:
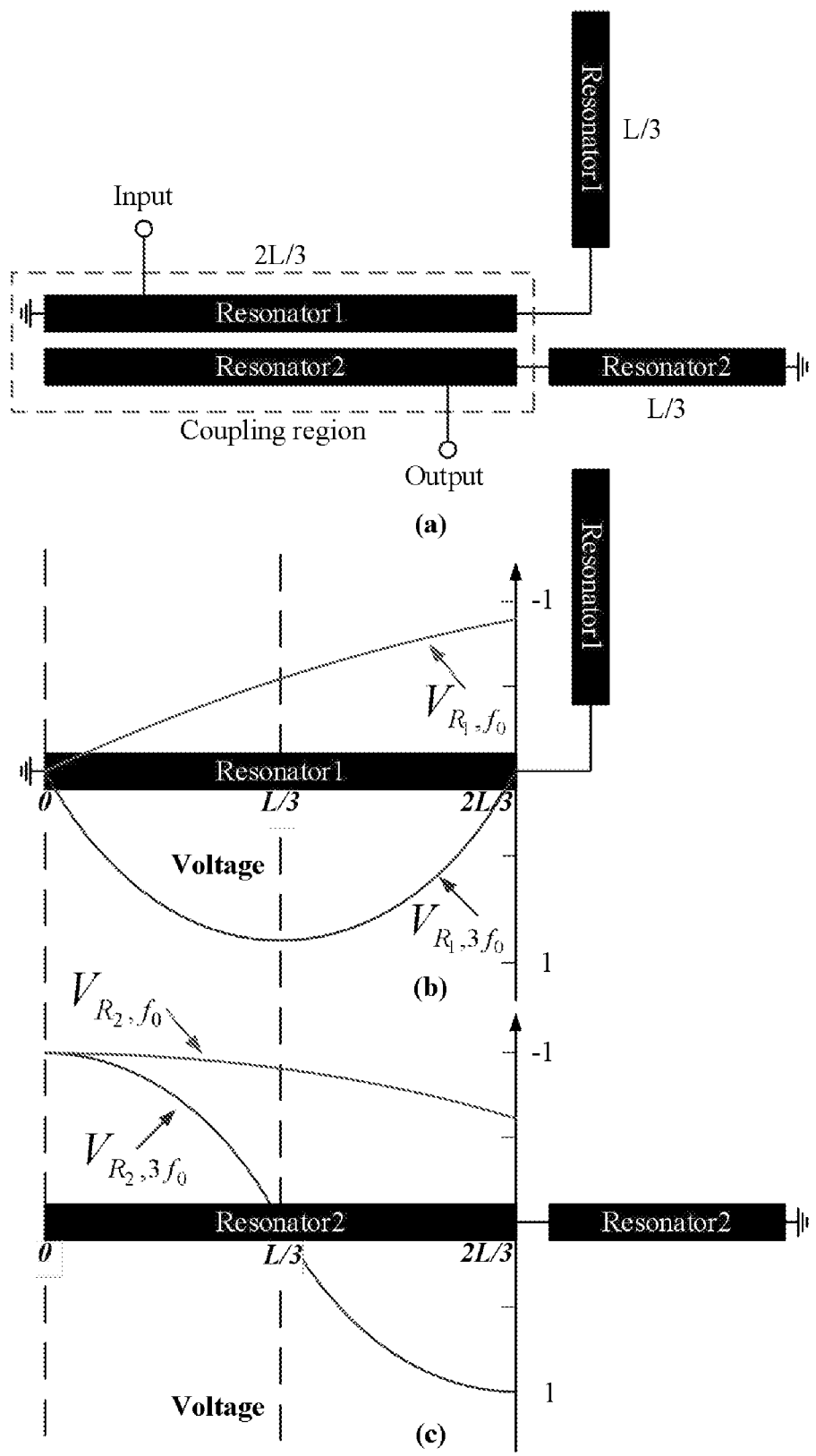
FIG. 4 is a schematic diagram of the voltage distributions in a bandpass filter with discriminating coupling according to an embodiment of the present application.

FIG. 4 is a schematic diagram of a bandpass filter with discriminating coupling according to an embodiment of the present application. Here, $G_{opt}=0.053$ is chosen and $Y_n$ in previous section is calculated to provide the continuous modes operations with the required admittance.

As shown in FIG. 4, the OMN is just consisted of a tuning microstrip line and a BPF with two $\lambda_g/4$ resonators 1 and 2 discriminatively coupled to each other. It can be found that the OMN is concise in configuration and compact in size. In this embodiment, the first resonator 1 has a coupling region of ⅔ L starting from the first short end and the second resonator 2 has a coupling region of ⅔ L starting from the second open end, wherein L represents the lengths of the first resonator 1 and the second resonator 2 which are both equal to $\lambda_g/4$, wherein $\lambda_g$ represents a waveguide wavelength at working frequency. The first short end of the first resonator 1 is aligned with the second open end of the second resonator 2.

The BPF exits the fundamental passband and the third harmonic spurious passband as the $\lambda_g/4$ resonators are employed in this embodiment. The overall coupling strength at each mode can be described by the sum of electric coupling coefficient $k_e$ and magnetic coupling coefficient $k_m$. On the microstrip resonators, the dominant mode is quasi-TEM and the electric coupling coefficient is expressed as follows:

$$k_e = p \times \frac{\int V_1(x)V_2(x)dx}{\sqrt{\int |V_1(x)|^2 dx \times \int |V_2(x)|^2 dx}}; \quad (5)$$

wherein $V_1$ and $V_2$ are the voltage distributions on the lines within the coupling regions of the first resonator 1 and the second resonator 2 and p is a constant. The voltages at the open end and short end of the resonator are the maximum and zero, respectively. The normalized voltages at $3f_0$ on the first resonator 1 $V_{R_1,3f_0}$ and on the second resonator 2 $V_{R_2,3f_0}$ are expressed, respectively as follows:

$$V_{R_1,3f_0} = \cos[3\beta_0(x-L)] \quad (6);$$

$$V_{R_2,3f_0} = \cos(3\beta_0 x). \quad (7);$$

where $\beta_0$ is the propagation constant at $f_0$. By substituting equations (6) and (7) into equation (5), the coupling strength at $3f_0$ is:

$$k_{e,3f_0} = \frac{p \times \int_0^{2L/3} V_{R_1,3f_0}(x) \times V_{R_2,3f_0}(x)dx}{\sqrt{\int_0^{2L/3}|V_{R_1,3f_0}(x)|^2 dx}\sqrt{\int_0^{2L/3}|V_{R_2,3f_0}(x)|^2 dx}} = \quad (8)$$

$$\frac{p \times \int_0^{2L/3} \cos[3\beta_0(x-L)] \times \cos(3\beta_0 x)dx}{\sqrt{\int_0^{2L/3}|\cos[3\beta_0(x-L)]|^2 dx}\sqrt{\int_0^{2L/3}|\cos(3\beta_0 x)|^2 dx}} = 0.$$

As in equation (8), $V_{R_1,3f_0}$ is an even function while $V_{R_2,3f_0}$ is an odd function in the coupling region. The integrand in the numerator is zero, which represents the electric coupling coefficient $k_{e,3f_0}$ should be zero, likewise $k_{m,3f_0}$ also should be zero. Therefore, the total coupling strength $k_{(1,2),3f_0}$ should zero at the third harmonic.

The coupling matrix of the filter is used for calculating the input impedance of the third harmonic and the coupling matrix of a second-order BPF is expressed as follows:

$$M_{initial} = \begin{matrix} & S & 1 & 2 & L \\ S & \begin{bmatrix} 0 & M_{S1} & 0 & 0 \\ 1 & M_{S1} & M_{11} & M_{12} & 0 \\ 2 & 0 & M_{12} & M_{22} & M_{2L} \\ L & 0 & 0 & M_{2L} & 0 \end{bmatrix} \end{matrix}. \quad (9).$$

Accordingly, as shown in FIG. 2, the input impedance at node A can be expressed as follows:

$$Z_A = \frac{M_{12}^2 - M_{11}(M_{22} - jM_{2L}^2)}{M_{S1}^2(M_{2L}^2 + jM_{22})}. \quad (10).$$

In this equation, as $M_{12,3f_0}=k_{(1,2),3f_0}/FBW$, $M_{12,3f_0}$ equals to zero at $3f_0$, and meanwhile, the lengths of the two resonators are the same guaranteeing discriminating coupling. Thus, $M_{11,3f_0}$ and $M_{22,3f_0}$ have the same values.

Then, the input impedance at $3f_0$ is simplified as follows:

$$Z_{A,3f_0} = \frac{jM_{11,3f_0}}{M_{S1,3f_0}^2}. \quad (11).$$

The values of $M_{11,3f_0}$ and $M_{22,3f_0}$ can be adjusted accordingly by tuning the length of the resonators slightly. It should be noted that, $M_{S1,3f_0}$ is related with the input position, and an arbitrary reactance can be obtained at node A. The short-circuit at the current generator plane (I-gen plane) can be realized in a relatively easy way by the mentioned design. From the above analysis, it can be concluded that the third harmonic is shorted at the I-gen plane without requiring any extra circuit by using the discriminating coupling. The requirement of the extended $CCF^{-1}$ PA is fulfilled.

The equation (4) can be used for calculating the impedance region in the Smith Chart of the second harmonic. The calculated second impedances at the intrinsic I-gen plane are converted to the required second harmonic impedances at the package plane for design convenience. The input impedance at the second harmonic $Z_{B,2f_0}$ at a proper value must be design to fulfill the requirement.

As the second harmonic is suppressed by the 4/4 resonator filter intrinsically, the input impedance $Z_{A,2f_0}$ at $2f_0$ is a reactive value, and $Z_{B,2f_0}$ is calculated as follows:

$$Z_{B,2f_0} = Z_T \frac{Z_{A,2f_0} + jZ_T \tan\theta_{T,2f_0}}{Z_T + jZ_{A,2f_0}\tan\theta_{T,2f_0}}. \quad (17)$$

where $Z_T$ is the characteristic impedance of the tuning microstrip line. Just because the extended $CCF^{-1}$ mode is employed, the required impedance of the second harmonic has a large design freedom which provides great freedom of $Z_T$ and $\theta_{T,2f_0}$.

It should be noted that the second harmonic impedance condition of the extended $CCF^{-1}$ PA can be extended on the current generating surface by adjusting the characteristic impedance and length of the tuning microstrip line. Meanwhile, it also should be noted that the difficulty of matching the fundamental impedance of the filter can be reduced by converting the fundamental complex impedance at point A into an impedance at point B with a smaller imaginary through adjusting the length of the tuning microstrip line.

The DC bias circuit 20 is simply connected at the short-end of the first resonator, and in such a way that the bias scheme can terminate the second harmonic in the defined region when comparing with the conventional bias.

The fundamental impedance conversion is analyzed by the coupling matrix of the BPF at $f_p$. When designing the wideband filtering PA, a low Q-factor BPF in the OMN is required. It is found that the desired BPF response has 30% fractional bandwidth (FBW) and 0.14 dB insertion loss, and the initial coupling matrix with the impedance normalized to $1\Omega$ is synthesized as follows:

$$M_{initial,f_0} = \begin{bmatrix} 0 & 1.037 & 0 & 0 \\ 1.037 & 0 & -1.287 & 0 \\ 0 & -1.287 & 0 & 1.037 \\ 0 & 0 & 1.037 & 0 \end{bmatrix}. \quad (17)$$

Starting with $M_{11}=M_{22}=0$, the normalized input impedance at $f_0$ can be expressed by equation (18)

$$Z_{A,f_0} = \frac{M_{12}^2}{M_{S1}^2 M_{2L}^2}. \quad (18)$$

$M_{S1}$, $M_{11}$ and $M_{22}$ are modified as $M_{S1}'M_{11}'$ and $M_{22}'$ for performing the complex impedance conversion, and then the coupling matrix with complex input impedance is modified as follows:

$$M_{modified,f_0} = \begin{bmatrix} 0 & M_{S1}' & 0 & 0 \\ M_{S1}' & M_{11}' & M_{12} & 0 \\ 0 & M_{12} & M_{22}' & M_{2L} \\ 0 & 0 & M_{2L} & 0 \end{bmatrix}. \quad (19)$$

The modified normalized input impedance can be expressed as follows:

$$\begin{cases} Z_{A,f_0}' = Z_{A,f_0} \times (R+jX) = \frac{M_{12}^2(R+jX)}{M_{S1}^2 M_{2L}^2} \\ Z_{A,f_0}' = \frac{M_{12}^2 - M_{11}'(M_{22}' - jM_{2L}^2)}{M_{S1}'^2(M_{2L}^2 + jM_{22}')} \end{cases} \quad (20)$$

Assuming $M_{11}=M_{22}$, the modified $M_{S1}'M_{11}'$ and $M_{22}'$ are calculated by solving the equation (20).

The impedance region of fundamental signal at package plane is converted from I-gen plane at 1.8 GHz with $-1 \le \gamma \le 1$ and $0 \le \alpha \le 0.4$, and the normalized $Z_{B,f_0}=(0.37+j0.41)\Omega$ is selected in the package plane region. Moreover, the tuning microstrip line transforms the desired complex load impedance to an impedance with a small imaginary part for filtering in an easy way, then $Z_{A,f_0}'=(0.33+j0.18)\Omega$ is obtained. The modified coupling matrix can be expressed as follows:

$$M_{modified,f_0} = \begin{bmatrix} 0 & 1.229 & 0 & 0 \\ 1.229 & 1.164 & -1.287 & 0 \\ 0 & -1.287 & 1.164 & 1.037 \\ 0 & 0 & 1.037 & 0 \end{bmatrix}. \quad (20)$$

When the value of $Z_{A,f_0}'$ is converted to $50\Omega$ by the discriminating coupling filter in the output matching network, the coupling coefficient and the external quality factors of the BPF should fulfill the matrix, and the coupling coefficient $K_{(1,2),f_0}$ between the first resonator 1 and the second resonator 2 as well as the external quality factors $Q_{ein,f_0}'$ and $Q_{eout,f_0}$ are calculated by equations (21)-(22):

$$k_{(1,2),f_0} = FBW \times M_{12} \quad (21)$$

$$Q_{ein,f_0}' = \frac{1}{FBW \times M_{S1}'^2} \quad Q_{eout,f_0} = \frac{1}{FBW \times M_{2L}^2}. \quad (22)$$

Accordingly, the three values of $k_{(1,2),f_0}$, $Q_{ein,f_0}'$ and $Q_{eout,f_0}$ are as follows: $k_{(1,2),f_0}=0.39$, $Q_{ein,f_0}'=2.21$, and $Q_{eout,f_0}=3.10$.

According to the coupling coefficient equation (5), the coupling strength $k_{(1,2),f_0}$ of the BPF at $f_0$ is:

$$k_{e,f_0} = \frac{p \times \int_0^{2L/3} V_{R_1,f_0}(x) \times V_{R_2,f_0}(x)dx}{\sqrt{\int_0^{2L/3}|V_{R_1,f_0}(x)|^2 dx} \sqrt{\int_0^{2L/3}|V_{R_2,f_0}(x)|^2 dx}} \ne 0. \quad (23)$$

Where, $V_{R_1,f_0}$ and $V_{R_2,f_0}$ represent the fundamental voltage distributions of Resonator 1 and Resonator 2 in FIG. 4, respectively. Although the coupling coefficient at $3f_0$ is zero, the coupling coefficient at $f_0$ is not. The desired value of $k_{(1,2),f_0}$, can be modulated by optimizing the gap, and meanwhile, the desired values of $Q_{ein,f_0}'$ and $Q_{eout,f_0}$ can also be adjusted by modifying the input positions of feeding lines. Once the required values of the $k_{(1,2),f_0}$, $Q_{ein,f_0}'$ and $Q_{eout,f_0}$ are satisfied, the required impedance condition and filtering response are also satisfied.

Figure 5:
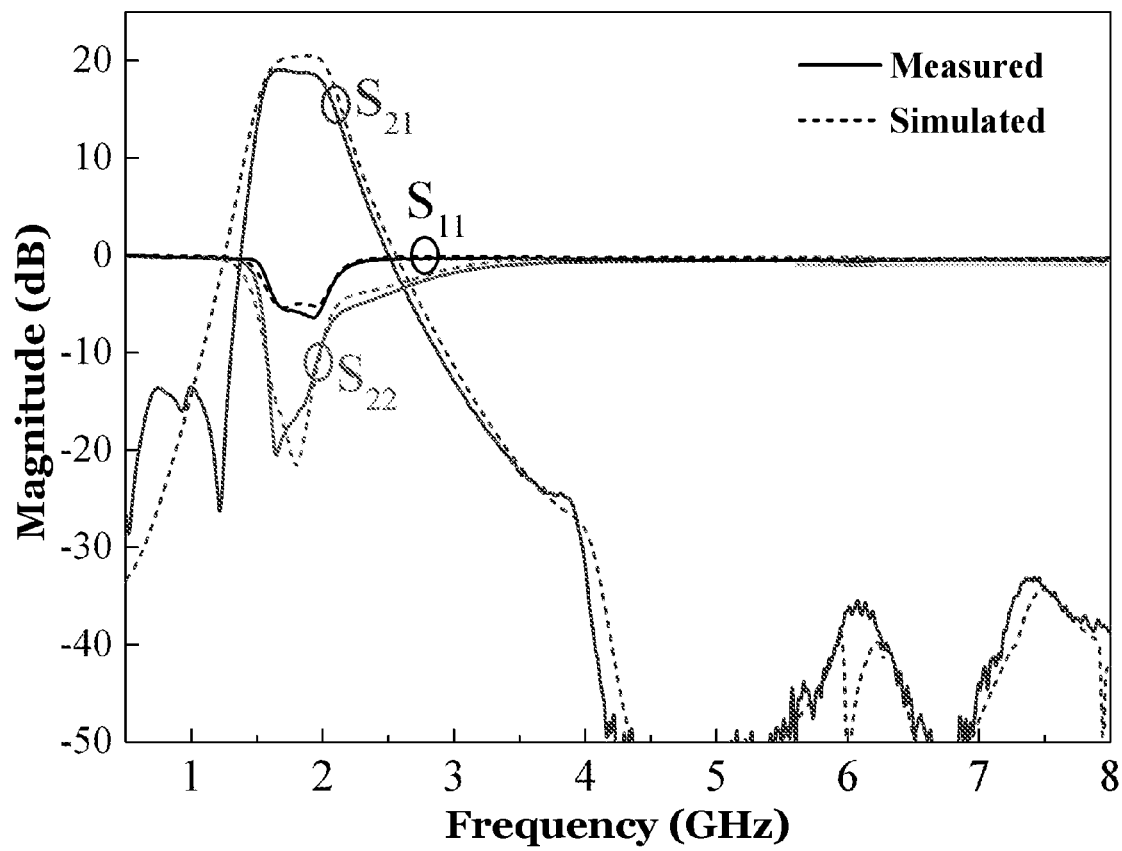
FIG. 5 shows measured and simulated S-parameters of the wide bandpass filtering power amplifier using discriminating coupling according to an embodiment of the present application.

FIG. 5 shows measured and simulated S-parameters of the wide bandpass filtering power amplifier using discriminating coupling according to an embodiment of the present application. A preselect Chebyshev BPF is utilized as the input matching network (IMN) for improving the roll-off at the passband edges, and obtaining the input matching.

By the implementation of the wide bandpass filtering power amplifier using discriminating coupling, several advantages can be obtained. The complexity and the area of the filtering power amplifier are effectively reduced while possessing the frequency selectivity. Meanwhile the work efficiency and bandwidth of the filtering power amplifier are effectively improved by taking both of the extended continuous mode theory and filter synthesis theory into account to guide the design of the wide bandpass filtering power amplifier.

To sum up, the present application relates to wide bandpass filtering power amplifier using discriminating coupling which is an extended $CCF^{-1}$ mode PA integrated with a discriminating coupling BPF, and the technical solution and effect of the extended $CCF^{-1}$ mode and the OMN using discriminating coupling filter has been analyzed. The impedances of fundamental mode and the third harmonic have been converted to the desired values independently as the discriminating coupling is employed. At the same time, as the DC voltage is supplied through the BPF, it helps the second harmonic located in the wanted impedance region in the Smith Chart. The wide bandpass filtering power amplifier using discriminating coupling according to the present application has compact size, good frequency selectivity and high PAE of 73.5%. More importantly, it is further noted that the wide bandpass filtering power amplifier using discriminating coupling according to the present application processes 31.1% FBW with the PAE larger than 60% and it would be useful in the miniaturized digital transmitters with the relative wide PAE bandwidth.

The foregoing is a further detailed description of the present application in connection with specific preferred embodiments, and cannot be considered as that the specific implementation of the present application is limited to these illustrations. It will be apparent to those skilled in the art that any various modifications or substitutions may be made to the present application without departing from the spirit of the application, and such modifications or substitutions should be considered as falling within the scope of the present application.

What is claimed is:

1. A wide bandpass filtering power amplifier comprising a DC bias circuit, an input impedance matching circuit, a transistor and an output impedance matching circuit, wherein the DC bias circuit is connected to the input impedance matching circuit which is further connected to the transistor, and the transistor is further connected to the output impedance matching circuit which comprising a tuning microstrip line and a bandpass filter, wherein the tuning microstrip line is connected between the transistor and the bandpass filter; wherein the bandpass filter comprises a first resonator and a second resonator parallelly coupled with each other; wherein the first resonator comprises a first short end and a first open end, and the second resonator comprises a second short end and a second open end, wherein the first resonator has a coupling region of ⅔ L1 starting from the first short end and the second resonator has a coupling region of ⅔ L2 starting from the second open end, wherein L1 represents a length of the first resonator and L2 represents a length of the second resonator.

2. The wide bandpass filtering power amplifier according to claim 1, wherein $L1=L2=\lambda_g/4$, wherein $\lambda_g$ represents a waveguide wavelength at working frequency.

3. The wide bandpass filtering power amplifier according to claim 1, the first short end of the first resonator is aligned with the second open end of the second resonator.

4. The wide bandpass filtering power amplifier according to claim 1, the first short end of the first resonator is connected to a DC power source, and is further grounded via a capacitor.

5. The wide bandpass filtering power amplifier according to claim 1, wherein an input terminal of the bandpass filter is connected to the first resonator, and an output terminal of the bandpass filter is connected to the second resonator.

6. The wide bandpass filtering power amplifier according to claim 1, wherein an input terminal of the tuning microstrip line is connected to the drain of the transistor, an output terminal of the tuning microstrip line is connected to an input terminal of the bandpass filter whose output terminal is matched to a load impedance.

7. The wide bandpass filtering power amplifier according to claim 1, wherein a length of the tuning microstrip line depends on an imaginary part of an optimal fundamental impedance matching point.

8. The wide bandpass filtering power amplifier according to claim 1, wherein the input impedance matching network of the bandpass filter is a Chebyshev bandpass filter.

9. The wide bandpass filtering power amplifier according to claim 1, wherein the transistor is a GaN HEMT CGH40010F transistor.

10. A wide bandpass filtering power amplifier comprising a DC bias circuit, an input impedance matching circuit, a transistor and an output impedance matching circuit, wherein the DC bias circuit is connected to the input impedance matching circuit which is further connected to the transistor, and the transistor is further connected to the output impedance matching circuit which comprising a tuning microstrip line and a bandpass filter, wherein the tuning microstrip line is connected between the transistor and the bandpass filter; wherein the bandpass filter comprises a first resonator and a second resonator parallelly coupled with each other; wherein the first resonator comprises a first microstrip line, a second microstrip line, a third microstrip line and a fourth microstrip line connected sequentially, and the second resonator comprise a fifth microstrip line, a sixth microstrip line, a seventh microstrip line and an eighth microstrip line connected sequentially.

11. The wide bandpass filtering power amplifier according to claim 10, wherein the second microstrip line, the third microstrip line and the fourth microstrip line of the first resonator are respectively parallelly coupled with the fifth microstrip line, the sixth microstrip line and the seventh microstrip line of the second resonator.

12. The wide bandpass filtering power amplifier according to claim 11, wherein the second microstrip line, the third microstrip line and the fourth microstrip line of the first resonator are connected in a direct line, while the fifth microstrip line, the sixth microstrip line and the seventh microstrip line of the second resonator are also connected in a direct line.

13. The wide bandpass filtering power amplifier according to claim 12, wherein the first microstrip line and the second microstrip line of the first resonator are vertically connected with each other, while the seventh microstrip line and the eighth microstrip line of the second resonator are connected with each other in a direct line.

14. The wide bandpass filtering power amplifier according to claim 10, wherein an input terminal of the bandpass filter is connected between the third microstrip line and the fourth microstrip line, and an output terminal of the bandpass filter is connected between the seventh microstrip line and the sixth microstrip line.

* * * * *